United States Patent [19]

Kameda et al.

[11] Patent Number: 5,745,222

[45] Date of Patent: Apr. 28, 1998

[54] APPARATUS FOR MAKING A STAMP FROM AN ORIGINAL PICTURE

[75] Inventors: Takanobu Kameda; Machiko Kano; Rui Kondoh, all of Tokyo; Kenich Nakajima, Suwa, all of Japan

[73] Assignees: King Jim Co.; Seiko Epson Corporation, both of Japan

[21] Appl. No.: 516,875

[22] Filed: Aug. 18, 1995

[30] Foreign Application Priority Data

Aug. 23, 1994 [JP] Japan .................. 6-198478

[51] Int. Cl.$^6$ .......................... G03B 27/02; G03B 27/52
[52] U.S. Cl. .................. 355/72; 355/100; 355/102; 355/103; 355/99; 355/85
[58] Field of Search ........................ 355/72, 90, 100, 355/102, 103, 99, 85

[56] References Cited

U.S. PATENT DOCUMENTS

| 4,714,957 | 12/1987 | Takano . |
| 5,389,476 | 2/1995 | Krucko ................ 430/22 |

FOREIGN PATENT DOCUMENTS

| 2694644 | 11/1994 | France . |
| 46-22642 | 6/1971 | Japan . |
| 52-56688 | of 1977 | Japan . |
| 55-154198 | 12/1980 | Japan . |
| 60-54434 | 3/1985 | Japan . |
| 62-52553 | 3/1987 | Japan . |
| 62-54254 | 3/1987 | Japan . |
| 1105271 | 4/1989 | Japan . |
| 2-179783 | 7/1990 | Japan . |
| 2179783 | 7/1990 | Japan . |
| 3-147849 | 6/1991 | Japan . |
| 4226778 | 8/1992 | Japan . |
| 4332645 | 11/1992 | Japan . |
| 4347681 | 12/1992 | Japan . |
| 2251214 | 1/1992 | United Kingdom . |

*Primary Examiner*—R. L. Moses
*Assistant Examiner*—Shival Virmani
*Attorney, Agent, or Firm*—Lorusso & Loud

[57] ABSTRACT

A compact print making device by which a desired imprint figure can be made easily in a short time. This print making device employs a resin seal face member, a part of which receives light having a wavelength within a predetermined range and thus is put into a state different from the state of the remaining part thereof and is adapted to have an uneven face formed by being acted upon by a predetermined fluid. The resin seal face member and an original picture representing an imprint figure are arranged with the original picture just in back of the resin seal face member. Imprint figure information representing the imprint figure shown in the original picture is taken in by an information reading mechanism. A negative film making unit is driven according to the imprint figure information so as to produce a negative film. Then, the produced negative film is carried to an irradiating position. Subsequently, a light irradiating unit irradiates the resin seal face member with light through the negative film. Thereby, the state of the area, which corresponds to the imprint figure, of the resin seal face member or the remaining part thereof is changed. Finally, an uneven face serving as a seal is formed by applying a developing fluid to this resin seal face member.

19 Claims, 8 Drawing Sheets

APPARATUS FOR MAKING A STAMP FROM AN ORIGINAL PICTURE

BACKGROUND OF THE INVENTION

1. Field of The Invention

The present invention generally relates to a print making device and more particularly to a print making device by which a person other than an expert and a professional can easily make a desired print such as a seal and a display plate.

2. Description of The Related Art

Previously, there has been commercially available a seal making device (strictly speaking, a seal making kit) by which a person other than an expert can make a seal.

This conventional seal making device (not shown) is provided with an ultraviolet-sensitive film, an ultraviolet irradiating unit, a planar ultraviolet setting resin member and a stock. Further, a seal is made by using this conventional seal making device in the following manner. Incidentally, the ultraviolet irradiating unit consists of a casing in which an ultraviolet fluorescent lamp is enclosed, a timer for permitting a user to set a time during which the ultraviolet fluorescent lamp is on, a transparent mount or stage plate for transmitting ultraviolet rays, which is provided on the top of the casing, and an openable lid for preventing the transmitted ultraviolet rays from coming out of the transparent stage plate. Further, the ultraviolet setting resin member is composed of an ultraviolet-insensitive base layer and an ultraviolet curable resin layer. Additionally, the base layer is thinner than the ultraviolet curable resin layer.

In the case where a seal is made by using this conventional seal making device, an original picture of characters and figures (hereunder referred to as an imprint figure) to be transferred onto paper by impressing the seal is first drawn up by drafting the imprint figure on ultraviolet transmitting paper such as tracing paper.

Thereafter, the original picture and the ultraviolet-sensitive film are superimposed on the transparent stage plate of the ultraviolet irradiating unit. Subsequently, the lid is closed. Then, a time, during which ultraviolet light is irradiated according to the quality of paper on which the original picture is drafted, is set by using the timer. Thus ultraviolet light is irradiated from the ultraviolet lamp onto the film for the set time. The film exposed in this manner is next washed a developing liquid (in the case of the commercially available conventional device, this liquid is water) so as to obtain a negative film on which the imprint figure is reversed. That is, on the negative film obtained in this way, the dark tone portions of the imprint figure appear transparent to ultraviolet light and the remaining portions thereof appear brown (namely, a color obtained as the result of ultraviolet absorption).

Next, this negative film and the ultraviolet setting resin member are superimposed on the transparent stage plate of the ultraviolet irradiating unit. Subsequently, the lid is closed. Further, ultraviolet light is then irradiated from the ultraviolet lamp onto the film for a predetermined time. This irradiation of ultraviolet light results in the hardening of portions (corresponding to the dark tone portions of the imprint figure) of the ultraviolet setting resin member, which are irradiated with the ultraviolet light. In contrast, the remaining portions of the ultraviolet setting resin member are not hardened. Upon completion of such a setting processing, the ultraviolet setting resin member is washed with a developing liquid (in the case of the commercially available conventional device, this liquid is water) so as to remove the unhardened portions therefrom. Thereby, a seal face member, in which the hardened portions (corresponding to the imprint figure) of the ultraviolet setting resin layer project from the base layers of the remaining portions of the ultraviolet setting resin member, is completed. Subsequently, the fixation of the seal face member completed in this way is performed by further irradiating ultraviolet thereon.

Then, this seal face member is fitted to the stock, so that the seal is completed.

The aforementioned conventional seal making device, however, has drawbacks in that a maker should perform a very large number of operations which include the operations of making an original picture and in that the efficiency is low and the time required for making a seal is long. These drawbacks are mainly due to the fact that although information on an imprint figure is included in an original picture, this information can not be utilized directly for making the seal face member, namely, the maker should produce a negative film by himself as an intermediate product. Further, excepting a case where an original picture is made by handwriting an imprint figure intentionally, the maker comes to use what is called a word processor or the like when an original picture is made by using a predetermined typestyle or typeface. Moreover, it becomes necessary for the maker to copy the imprint figure, which is made by the word processor, onto ultraviolet transmitting paper by using an electronic copying machine or the like. Thus, the operation of making an original picture requires much time and trouble. Additionally, it is also necessary for the maker to set an ultraviolet irradiating time according to the thickness of the ultraviolet transmitting paper and the dark tone of a draft of the original picture. This operation requires skill to some extent.

Thus one of Applicants of the instant application has proposed various kinds of seal making devices, by which a person other than specialists for making seals can easily make a desired seal in a short time. Such seal making devices have been disclosed and proposed in the specifications and drawings of, for example, the Japanese Patent Applications No. 5-54090/1993, 5-69499/1993, 5-69500/1993 and 5-76565/1993. Further, prints such as a nameplate and a guide plate, which are produced by, for instance, printing a name and a guide sign on the surfaces of a resin seal face members, respectively, can be made similarly by using a device whose configuration is similar to the aforementioned seal making device.

Each of the print making devices disclosed in these applications is provided with an information reading means for taking in imprint figure information, a resin seal face member (made of, for example, an ultraviolet setting resin), a part of which receives light having a wavelength within a predetermined range and thus is put into a state different from the state of the remaining portion thereof and is adapted to have an uneven face formed by being acted upon by a predetermined fluid, a negative film making means for making a negative film function portion having a part corresponding to the imprint figure information or the remaining part thereof, which is adapted to transmit light having a wavelength within a predetermined range, and a light irradiating means for irradiating light having a wavelength within a predetermined range onto the resin seal face member through the negative film function portion.

Incidentally, these print making devices are different from one another in respect of the method for practically making a negative film. For example, in the case of one of such methods, a liquid crystal display panel is made to serve as a negative film by setting each cell of the liquid crystal display panel to be on or off. In the case of another method, an imprint figure is directly printed on the resin seal face member. Further, a portion of the member, to which a processing agent such as ink adheres, is made to serve as a negative film. In the case of a further method, a translucent sheet on which an imprint figure is printed, or an imprint figure part of an ink ribbon, whose state is changed into a translucent state, is made to serve as a negative film. In the case of still another method, a part of a heat reversible transmission changing film, which corresponds to an imprint figure, or the remaining part thereof is heated and is made to serve as a negative film.

In the case of a print making device for automatically making such a negative film (or a portion serving as a negative film), imprint figure information may be inputted by performing a character inputting method (primarily, keying in characters) similar to a method employed as the function of the word processor, alternatively, by performing an image inputting method by use of an image reading device.

However, in the case of the conventional print making device in which the information reading mechanism portion and the light irradiating mechanism portion are in parallel with each other in the main unit, a large space is taken up by the information reading mechanism portion. Moreover, the light irradiating portion also takes up a large space. Thus this conventional print making device has a drawback in that the size of the main unit thereof is large. Further, it is difficult to form a seal face (namely, the face of a seal), which corresponds to the imprint figure represented by the original picture, at a desired location on the resin seal face member. Thus this conventional print making device has encountered a problem in that it takes much time and trouble to make the face of a seal. Furthermore, this conventional print making device is inconvenient to verify the seal face formed on the resin seal face member after the seal is completed. This is because it is necessary for that purpose to actually stamp ink or the like onto the face of the seal and to subsequently affix the seal.

The present invention is accomplished in view of the aforementioned defects of the conventional seal making device.

Accordingly, an object of the present invention is to realize a compact high-reliability print making device, by which a desired seal face can be made quickly, at low cost.

SUMMARY OF THE INVENTION

To achieve the foregoing object, in accordance with an aspect of the present invention, there is provided a first print making device which comprises an information reading means for inputting imprint figure information, a resin seal face member, a part of which receives light having a wavelength within a predetermined range and thus is put into a state different from the state of the remaining part thereof and is adapted to have an uneven face formed by being acted upon by a predetermined fluid, a negative film making means for making a negative film function portion having a part corresponding to imprint figure information or the remaining part thereof, which is adapted to transmit light having a wavelength within a predetermined range, and a light irradiating means for irradiating light having a wavelength within a predetermined range onto the resin seal face member through the negative film function portion. Further, an original picture, which represents an imprint figure, is placed just in back of the resin seal face member. Moreover, the information reading means and the light irradiating means are placed in such a manner that the information reading means and the light irradiating means are opposite to each other and sandwich the original picture and the resin seal face member therebetween and that the information reading means faces the original picture, and the light irradiating means faces the resin seal face member.

Here, note that ink is partially removed from the negative film function portion, for example, throughout a printing processing. The part, from which the ink is partially removed, of the negative film function portion may be a translucent ink ribbon or a translucent sheet to which ink partially adheres by a printing processing.

Further, in accordance with another aspect of the present invention, there is provided a second print making devices which comprises an information reading means for taking in imprint figure information, a resin seal face member, a part of which receives light having a wavelength within a predetermined range and thus is put into a state different from the state of the remaining part thereof and is adapted to have an uneven face formed by contact with a developing fluid, a negative film making means for making a negative film function portion having a part corresponding to imprint figure information or the remaining part thereof, which is adapted to transmit light having a wavelength within a predetermined range, and a light irradiating means for irradiating light having a wavelength within a predetermined range onto the resin seal face member through the negative film function portion. Further, an original picture, which represents an imprint figure, is placed just in back of the resin seal face member. Moreover, the information reading means and the light irradiating means are placed in such a manner that the information reading means and the light irradiating means are opposite to each other and sandwich the original picture and the resin seal face member therebetween and that the information reading means faces the original picture, and the light irradiating means faces the resin seal face member. Furthermore, the negative film making means is adapted to transfer the imprint figure in such a manner that the transfer ratio of the negative film function portion to the imprint figure represented by the original picture becomes substantially equal to 1. The negative film making means is further adapted to carry the negative film function portion to a place between the seal face member and the light irradiating means and is moreover adapted to stop the negative film function portion at a location where the negative film function porion faces the seal face member. Additionally, the negative film making means is adapted to take the negative film function portion out of the location after the light irradiating means finishes irradiating the negative film function portion with the light.

Moreover, in accordance with a further aspect of the present invention, there is provided a third print making devices which comprises an information reading means for taking in imprint figure information, a resin seal face member, a part of which receives light having a wavelength within a predetermined range and thus is put into a state different from the state of the remaining portion thereof and is adapted to have an uneven face formed by being acted upon by a predetermined fluid, an application means for applying a processing agent, which prevents the transmission of light having a wavelength within a predetermined range and is removable, to a part of the resin seal face member, which corresponds to imprint figure information, or to the remaining part thereof, a light irradiating means for irradiating light having a wavelength within the predetermined range onto the resin seal face member after the processing agent is applied thereto, and an imprint-figure transfer control means for controlling the application means according to the imprint figure information taken in by the information reading means. Further, an original picture, which represents an imprint figure, is placed just in back of the resin seal face member. Moreover, the information reading means and the light irradiating means are placed in such a manner that the information reading means and the light irradiating means are opposite to each other and sandwich the original picture and the resin seal face member therebetween and that the information reading means faces the original picture, and the light irradiating means faces the resin seal face member.

Here, note that any material may be employed as of the processing agent as long as such a material can prevent the transmission of light having a wavelength within a predetermined range when applied to a part of the resin seal face member, which corresponds to imprint figure information, or to the remaining part thereof, and can be removed therefrom later. For example, the processing agent may be made of ink of the negative type, by which a part sensitized to the irradiated light is made insoluble in the predetermined fluid, or ink of the positive type, by which a part sensitized to the irradiated light is made soluble in the predetermined fluid.

In the case of the third print making device of the present invention, it is preferable that the imprint figure transfer control means is adapted to control the application means in such a manner that the ratio of the area of an imprint figure represented by the imprint figure information having been read by the information reading means to that of a part of the resin face member, to which the agent is applied by the application means, corresponding to the imprint figure information becomes substantially equal to 1. (Hereinafter, such a print making device will be sometimes referred to as a fourth print making device of the present invention.)

Preferably, each of the first to third print making devices of the present invention is further provided with an original picture holding member having an end face formed in such a manner as to hold an original picture, and with a seal face holding member having an end face formed in such a way as to hold the resin seal face member. Moreover, in the case of each of the first to third print making devices, it is preferable that fitting concave and convex portions, which can be fitted to each other, are formed in and on the other end faces of the original picture holding member and the seal face holding member, respectively, and that the original picture holding member and the seal face holding member are connected with each other through the fitting concave and convex portions. (Hereinafter, such a print making device will be sometimes referred to as a fifth print making device of the present invention.)

Preferably, the fifth print making devices of the present invention is further provided with an enclosure portion for enclosing an integrated member formed by interconnecting the original picture holding member, which holds the original picture, and the seal face holding member which holds the resin seal face member. Moreover, it is preferable that the information reading means is placed in such a manner as to face the translucent bottom wall of the enclosure portion and that the imprint figure represented by the original picture, which is contained in the integrated member enclosed in the enclosure portion, is read by the information reading means through the translucent bottom face. (Hereinafter, this print making device will be sometimes referred to as a sixth print making device of the present invention.)

As described above, in the case of each of the first and third print making devices, the original picture, which represents the imprint figure, is placed just in back of the resin seal face member. Moreover, the information reading means and the light irradiating means are placed or set in such a manner that the information reading means and the light irradiating means are opposite to each other and sandwich the original picture and the resin seal face member therebetween and that the information reading means faces the original picture, and the light irradiating means faces the resin seal face member.

Thus, in the case of each of the first and third print making devices, the compact placement of an image reading portion, which consists of the original picture and the information reading means, and a light irradiating portion, which consists of the resin seal face member and the light irradiating means, can be achieved. Thereby, the floor-space taken up by the main unit of the print making device can be reduced. Moreover, the main unit of the print making device can be downsized.

Similarly, in the case of the second print making device, the original picture representing the imprint figure is placed just in back of the resin seal face member. Moreover, the information reading means and the light irradiating means are placed or set in such a manner that the information reading means and the light irradiating means are opposite to each other and sandwich the original picture and the resin seal face member therebetween and that the information reading means faces the original picture, and the light irradiating means faces the resin seal face member. In addition, as described above, the negative film making means transfers the imprint figure in such a manner that the transfer ratio of the negative film function portion to the imprint figure represented by the original picture becomes substantially equal to 1. Further, the negative film making means carries the negative film function portion to a place between the seal face member and the light irradiating means. Moreover, the negative film making means stops the negative film function portion at a location where the negative film function porion faces the seal face member. Thereafter, the negative film making means takes out the negative film function portion from the location after the light irradiating means finishes irradiating the negative film function portion with the light.

Thus, in the case of the second print making device, the floor-space taken up by the main unit of the print making device can be reduced and the main unit thereof can be downsized, similarly as in the cases of the first and second print making devices. In addition to such advantages, the second print making device of the present invention has the following advantages.

Namely, an image having substantially the same size as of the imprint figure represented by the original picture is formed in the negative film function portion by the negative film making means. This negative film function portion is placed in a position where the negative film function portion faces the resin seal face member. When being in this position, the resin seal face member is irradiated with light by the light irradiating means through the negative film function portion. Thus a setting resin portion, which corresponds to the imprint figure represented by the original picture, can be surely formed in such a manner as to have substantially the same size as of the imprint figure represented by the original picture (in other words, there is no necessity of regulating the position and size of the setting resin portion formed in the resin seal face member). Thereby, the face of a seal can be formed quickly. Further, it is unnecessary for verifying the produced face of a seal to apply stamp ink or the like onto the face of the seal and to subsequently affix the seal. Consequently, the reliable face of the seal can be formed.

In the case of the fourth print making device, as stated above, the imprint figure transfer control means controls the application means in such a manner that the ratio of the area of the imprint figure represented by the imprint figure information having been read by the information reading means to that of a part of the resin face member, to which the agent is applied by the application means, corresponding to the imprint figure information, becomes substantially equal to 1.

Thus, in the case of the fourth print making device, an image having substantially the same size as of the imprint figure represented by the original picture can be formed on the resin seal face member by applying the agent thereto correspondingly to such an image. Moreover, an operation of transferring the imprint figure information, as well as the configuration of a circuit for performing such an operation, can be simplified.

Further, as described above, the fifth print making device of the present invention is further provided with an original picture holding member having an end face formed in such a manner as to hold an original picture, and with a seal face holding member having an end face formed in such a way as to hold the resin seal face member. Moreover, in the case of this print making device, the fitting concave and convex portions, which can be fitted to each other, are formed in and on the other end faces of the original picture holding member and the seal face holding member, respectively. Furthermore, the original picture holding member and the seal face holding member are connected with each other through the fitting concave and convex portions.

Thus, in the case of the fifth print making device, the original picture and the resin seal face member can be respectively held in the original picture holding member and the seal face holding member which are connected with each other. Consequently, the positioning of the original picture and the resin seal face member in the print making device can be facilitated.

Further, in the case of the fifth print making device, a desired seal face can be made by enclosing the integrated member, which is formed by interconnecting the original picture holding member and the seal face holding member, in a container of the print making device. Thus it is unnecessary to insert a spacing member (to be used for adjusting the length of a stamp unit to an optimal length) between the seal face holding member and the original picture holding member. Consequently, the print making device can be downsized.

Moreover, in the case of the fifth print making device, the integrated member formed by fitting the original picture holding member, which holds the original picture, and the seal face holding member, which holds the resin seal face member, to each other can be used as a stamp unit without using the aforementioned spacing member. Thus the portability of the stamp unit can be improved.

Furthermore, as described above, the sixth print making device is provided with the enclosure portion for enclosing an integrated member formed by interconnecting the original picture holding member, which holds the original picture, and the seal face holding member which holds the resin seal face member. Moreover, the information reading means is placed in such a manner as to face the translucent bottom wall of the enclosure portion. Additionally, the imprint figure represented by the original picture, which is contained in the integrated member enclosed in the enclosure portion, is read by the information reading means through the translucent bottom face.

Namely, in the case of the sixth print making device, the integrated member provided with the original picture and the resin seal face member is enclosed in the enclosure portion having the translucent bottom wall. Further, information on the imprint figure represented by the original picture can be read by the information reading means through the translucent bottom face. Therefore, the configuration of the enclosure portion can be simplified. Moreover, the original picture and so on can be stably enclosed or contained in the device. Thereby, the accuracy of the reading can be improved.

As described hereinabove, in accordance with the present invention, there is provided a compact print making device, by which a desired seal face can be made quickly, at low cost with high reliability.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Figure 1:
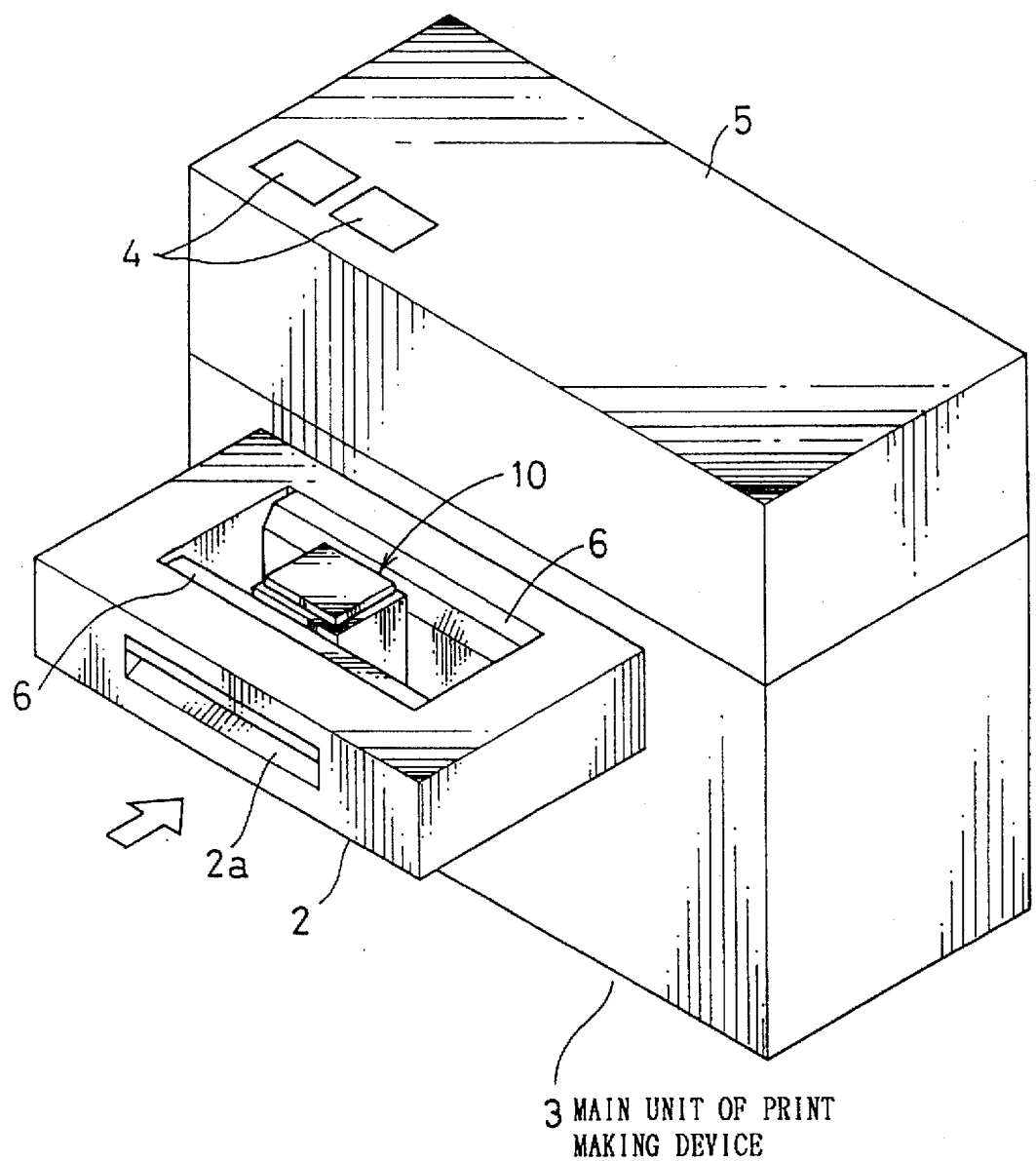
FIG. 1 is a perspective external view of a print making device, namely, a first embodiment of the present invention before use.
Figure 2:
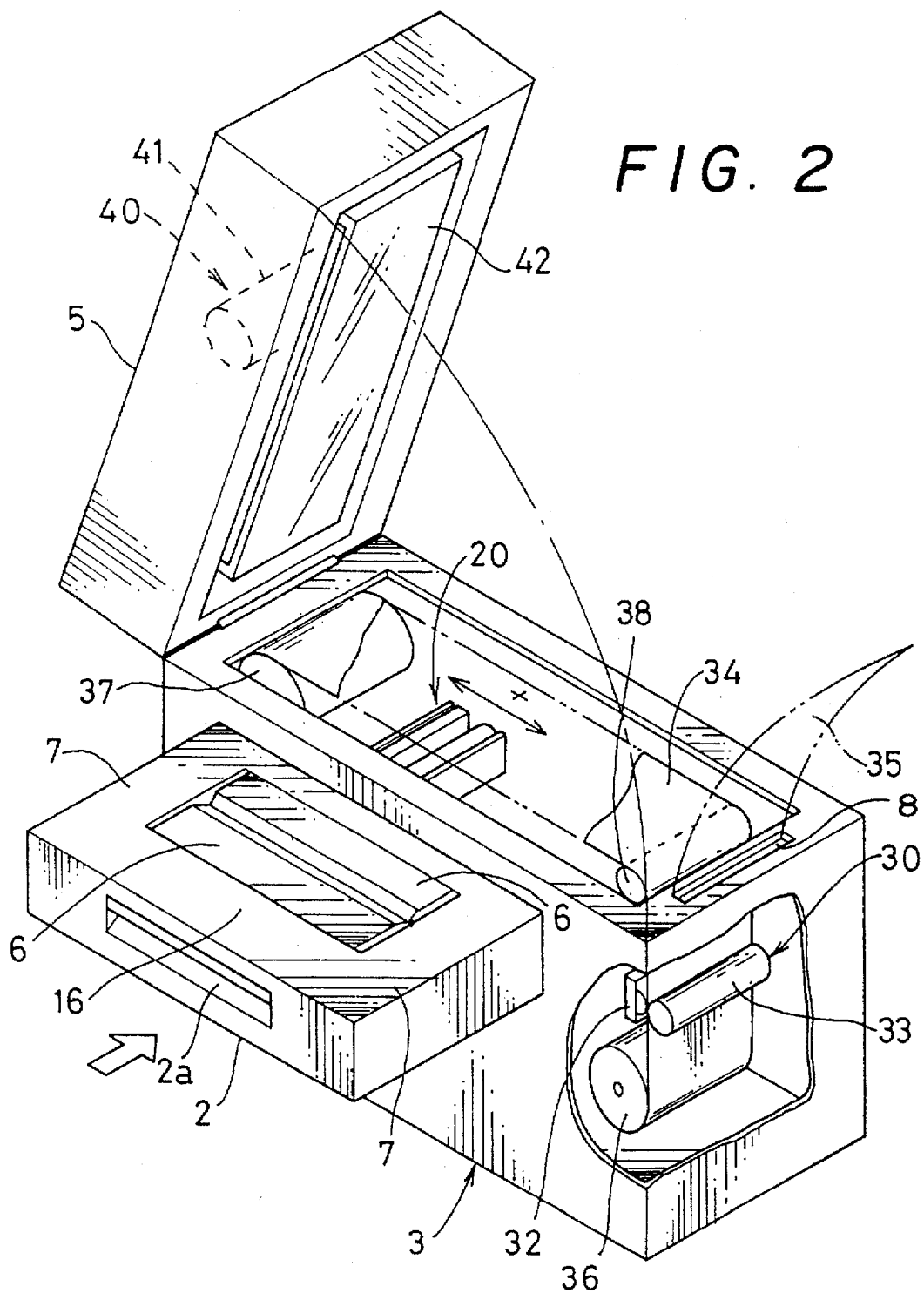
FIG. 2 is a partially sectional view of the print making device, namely, the first embodiment of the present invention, from which an original picture and a seal face member are removed.

Hereinafter, the preferred embodiments of the present invention will be described in detail by referring to the accompanying drawings.

(A) First Embodiment

A first example of a print making device embodying the present invention, namely, a first embodiment of the present invention will now be described in detail with reference to the drawings. Incidentally, this print making device, namely, the first embodiment of the present invention is an example of the application of the present invention to a seal making device and is characterized by a mechanical optical system. Therefore, the following description centers about the mechanical optical system. Further, the description of an electrical system will be omitted herein (incidentally, regarding the electrical system, refer to, for example, PCT International Application No. PCT/JP94/00409 corresponding to the Japanese Patent Application No. 5-69500/1993).

This print making device of the present invention consists of: a drawer 2 having a pull 2a, containing an original picture 1 representing an imprint figure and the main body 10 of a seal serving as an object to be engraved with the imprint figure; the main unit 3 thereof provided with an information reading mechanism 20 serving as an information reading means for taking in imprint figure information, namely, information on the imprint figure represented by the original picture 1, and with a negative film making means 30; and an openable cover unit 5 mounted on the top of the main unit 3, which is provided with a light irradiating means 40 and a group 4 of switches.

The main body 10 of the seal is composed of: a seal face holding member 11 constituted by a rectangular block (incidentally, the member 11 may be made of a material other than wood); a sponge member 12 (see FIG. 4), which is attached to an end portion of this seal face holding member 11, for absorbing a pressure and a resisting force when stamping paper with the seal and for making a convex portion of the seal face member fit well with the surface of paper (incidentally, this sponge member may be omitted); and a plate-like seal face member 13 provided on the surface of this sponge member 12.

In this case, the seal face member 13 is composed of: a base layer 13a, which is insensitive to ultraviolet; and an ultraviolet setting resin layer 13b which is exposed to ultraviolet As in the case of the conventional element, portions other than a set or hardened portion of the ultraviolet setting resin layer 13b can be removed therefrom by using a developing fluid (for example, water (incidentally, some kind of gas may be used instead of the liquid)).

Figure 3:
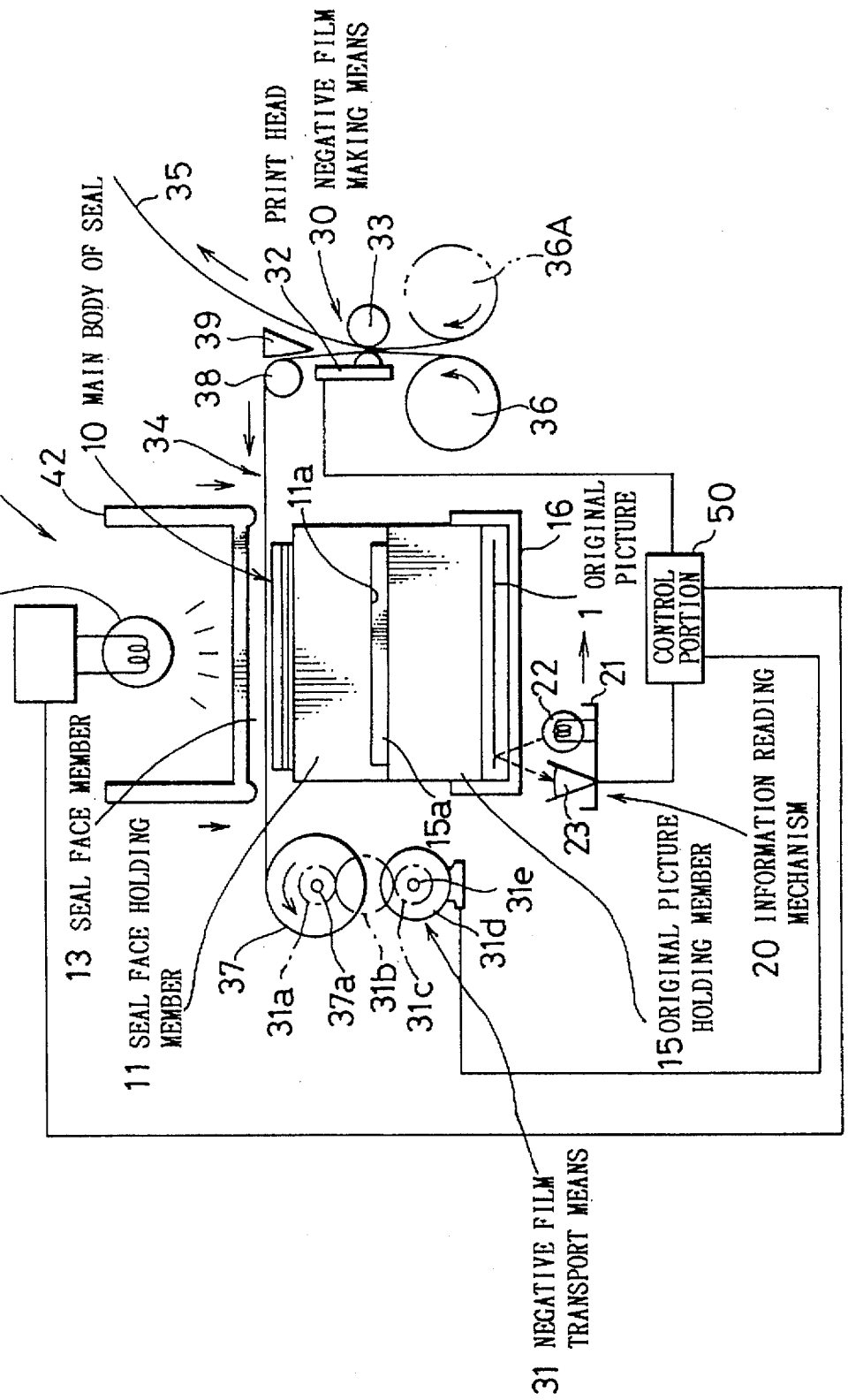
FIG. 3 is a schematic sectional view of the print making device, namely, the first embodiment of the present invention.

Further, a fitting convex portion 15a detachably fitted to a fitting concave portion 11a of the seal face holding member 11 is provided on an end face of an original picture holding member which is constituted by a rectangular block (incidentally, the original picture holding member may be made of wood). Furthermore, an integrated member is formed by fitting the fitting convex portion 15a to the fitting concave portion 11a. Moreover, the original picture 1 is attached to the other end face of the integrated original picture holding member 15 by utilizing, for instance, adhesion. Additionally, the resin seal face member 13 is attached to the other end face of the integrated seal face holding member 11. The integrated member is set in the original-picture/main-body-of-seal enclosing container 2 having a translucent bottom wall (not shown), which serves as an enclosure portion, when the device is in a state in which the original picture 1 is sandwiched between a translucent original-picture cover 16 (which may have no side walls (see FIG. 4)) and the original picture holding member 15 by adhesion or pressing. Thus the original picture holding member 15 and the seal face holding member 11 are assembled together as illustrated in FIG. 3. Incidentally, the shapes of the fitting concave portion 11a of the seal face holding member 11 and the fitting convex portion 15a of the original picture holding member 15 may be reversed.

Figure 4:
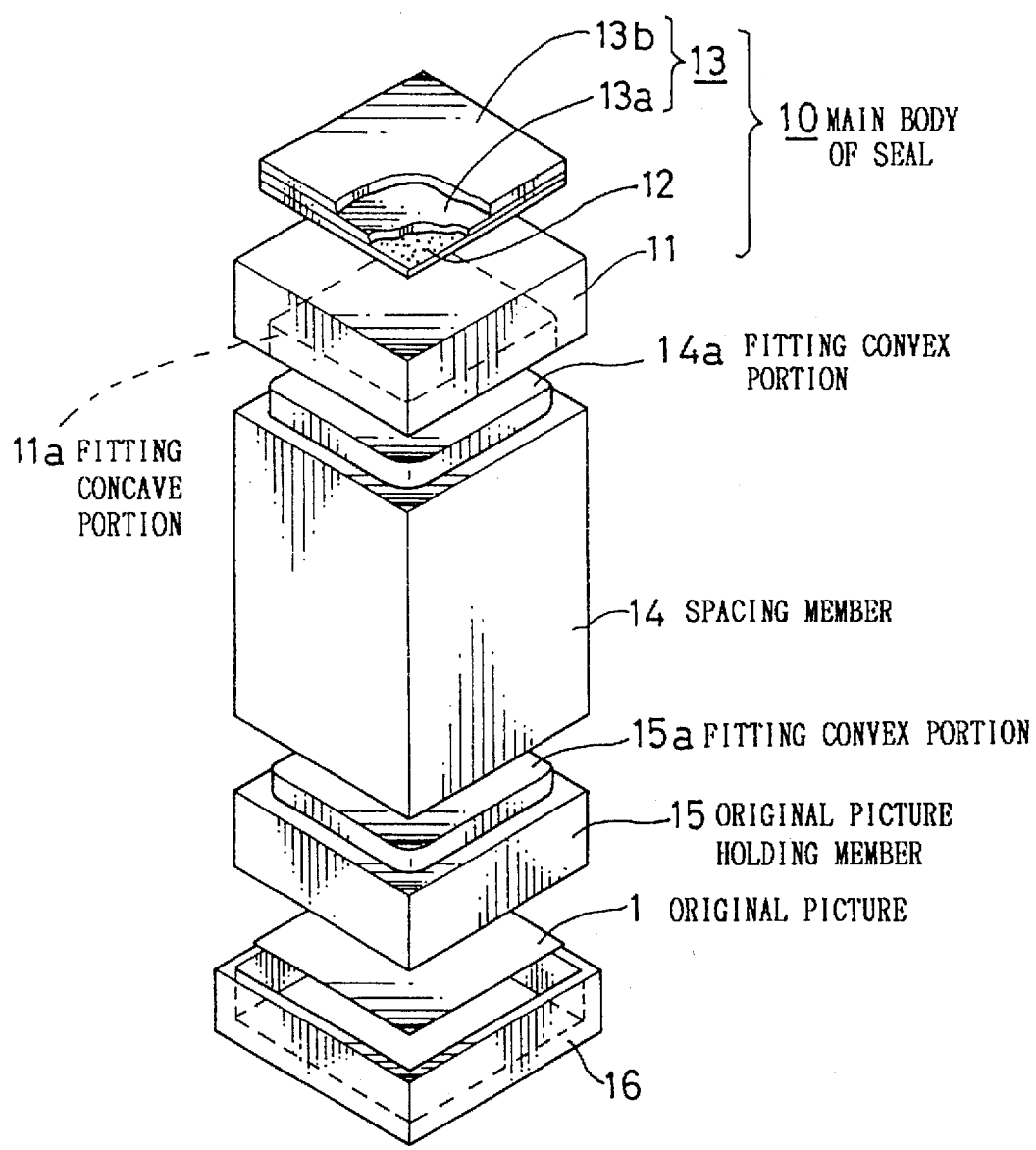
FIG. 4 is an exploded perspective diagram illustrating how an original picture and a resin seal face member are set in the print making device, namely, the first embodiment of the present invention.

FIG. 4 illustrates an example of the integration of the original picture holding member 11 and the original picture holding member 15 through a spacing member 14. The spacing member 14 has a fitting convex portion 14a, which can be detachably fitted to the fitting concave portion 11a of the seal face holding member 11, at an end face thereof and further has a bottom fitting concave portion (not shown), which can be detachably fitted to the fitting convex portion 15a of the original picture holding member 15, at the other end face thereof.

After a print is formed on the ultraviolet setting resin layer 13b of the main body 10 of the seal, the spacing member 14 is used for grasping the main body 10. Namely, the fitting convex portion 14a of the spacing member 14 is mated with fitting concave portion 11a of the seal face holding member 11 and the fitting convex portion 15a of the original picture holding member 15 is mated with the fitting concave portion 14a of the spacing member 14 after separation the seal face holding member 11 from the original picture holding member 15.

Incidentally, in the case of making a stamp unit by using the resin seal face member 13, the desirable height of the stamp unit is usually 60 m/m or so. If the desired height of the stamp unit can not be realized only by attaching the resin seal face member 13 to the integrated member consisting of the seal face holding member 11 and the original picture holding member 15, the spacing member 14 is inserted between the seal face holding member 11 and the original picture holding member 15.

In order to attach the resin seal face member 13 and the original picture 1 to the original-picture/main-body-of-seal enclosing container 2 in such a manner that the original picture 1 is placed just in back of the resin seal face member 13, each elastic pressing member 7 (see FIG. 5), such as a coiled spring, in a compressed state is preliminarily provided between a face, which is opposite to a corresponding one of the facing surfaces of a pair of presser members 6 and 6, and a corresponding side wall of the drawer container 2. Further, after the seal face holding member 11 and the original picture holding member 15, which engage with each other, are inserted between the both of the presser members 6 and 6 by opening up the space between the members 6 and 6 against the resilience force of the elastic pressing member 7, the seal face holding member 11 and the original picture holding member 15 can be set in a state where the seal face holding member 11 and the original picture holding member 15 are fixedly sandwiched between the presser members 6 and 6 by the resilience or elastic force of the elastic pressing member 7. Moreover, a plurality of sets of original pictures 1 and a plurality of main bodies 10 of a seal can be set in drawer container 2 at the same time.

Figure 5:
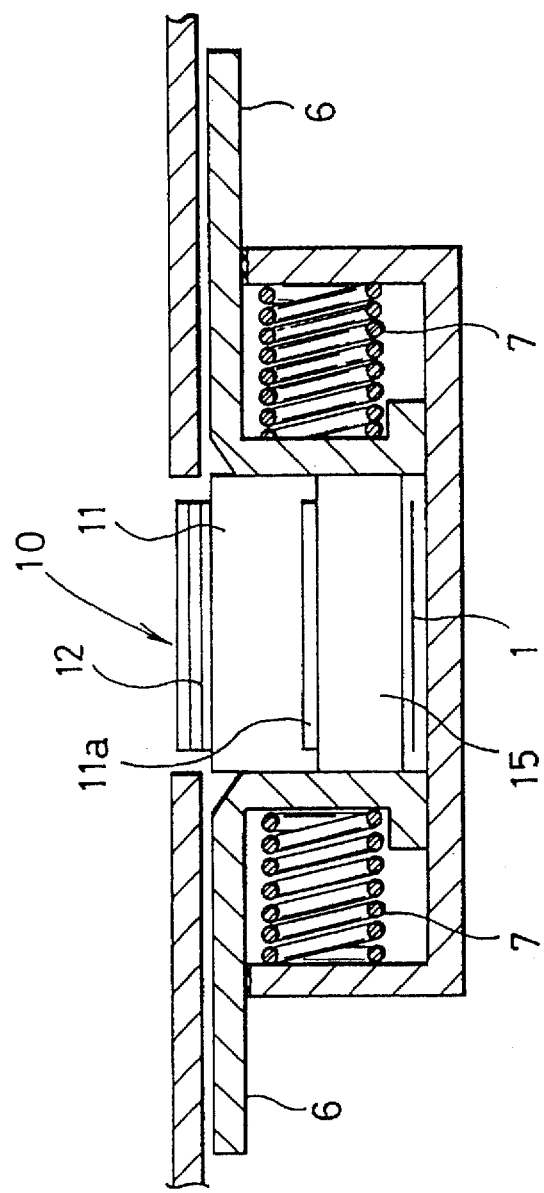
FIG. 5 is a sectional view of the print making device, namely, the first embodiment of the present invention, in which an original picture and a resin seal face member are set in another manner.

Incidentally, the enclosing space of the drawer container 2 is equal to the area and shape of the seal face member 13 of the maximum main body of the seal which can be handled by the main unit 3 of the print making device. FIG. 5 illustrates a state of the device in which the maximum permissible original picture 1 and the maximum permissible main body 10 of the seal are set. The enclosing space of the container 2, however, is selected as above described. The presser members 6 and 6 are brought closer together by the elastic force of the elastic pressing member 7. Therefore, original pictures 1 and main bodies 10 of seals, which are respectively smaller than the maximum permissible picture 1 and the maximum permissible main body 10 illustrated in this figure, can be set in the device. Incidentally, if the directions, in which both of the presser members 6 and 6 advance and retreat, are such that the enclosing space becomes narrower, as illustrated in this figure, the strokes of the members 6 and 6 can be shortened to allow reduction in size of the entire device.

While the original picture 1 and the main body 10 of the seal are set in the device as described hereinabove, the main body 10 of the seal having, for example, a rectangular section is mounted thereon such that a corner of the rectangle is coincident with a reference point of an orthogonal coordinate system. Further, the main body 10 of the seal having a circular or ellipsoidal section is loaded by way of a fixture jig into the print making device, similarly as in the case of the main body 10 of the seal having a rectangular section.

Incidentally, although a case, in which the original picture 1 and the main body 10 of the seal are mounted in the device by sandwiching the seal face holding member 11 and the original picture holding member 15 between the pair of the presser members 6 and 6, has been described in connection with this embodiment, it is not necessary to limit the structure of the device thereto. The seal face holding member 11 and the original picture holding member 15 may be securely sandwiched by using a side wall of the container 2 and one of the presser members 6. Further, the elastic pressing member 7 is not necessarily a coiled spring. For instance, a spring member such as a plate spring or a magnet member, may be employed as the elastic pressing member 7. Alternatively, a multi-step pressing mechanism using a rachet mechanism, which can move in steps, may be employed instead of the elastic pressing member 7.

The information reading mechanism 20 consists of an irradiating light source 22 and a one-dimensional photoelectric conversion sensor 23 which are mounted on the movable mechanism 21 for advancing and retreating in the X-direction. Further, the one-dimensional photoelectric conversion sensor 23 receives light which is emitted from the irradiating light source 22 and further reflected from the original picture laid on the translucent bottom wall (see FIGS. 1 and 3) of the container 2 and from portions other than the original picture through a translucent bottom plate. Then, the sensor 23 performs a photoelectric conversion for the received light and gives original-picture information, which serves as imprint figure information, and information concerning the portions other than the original picture, to a control portion 50 as serial electric signals. In the control portion 50 which has received the electrical signals from this information reading mechanism 20, the information represented by the electrical signals is compared with information preliminarily stored therein. Then, output signals of the control portion are transmitted to the negative film making means 30 and the light irradiating means 40, respectively.

A negative film drive portion 31 composing a negative film making means is constituted by a motor drive mechanism. In this negative film drive portion 31, for example, a driven gear 31a is mounted on a take-up shaft 37a of a take-up reel 37. Further, a drive gear 31c mounted on a drive shaft 31e of a drive motor 31d such as a step motor meshes with this driven gear 31a through a transmission gear 31b. Thereby, the take-up reel 37 is driven by a drive motor 31d, which receives a control signal from the control portion 50 and operates and thus rotates through a predetermined angle or a predetermined number of revolutions. Thus an ink ribbon 34 and a printing paper ribbon 35 can be let out of a supply reel 36. Incidentally, in this case, the take-up reel 37 is driven by the drive motor 31d through the transmission gear 31c. Such a structure is, however, not always necessary. Instead of employing such a structure, the drive gear 31c may mesh with the driven gear 31a. Alternatively, the power may be transmitted from the drive motor 31d to the take-up reel 37 through a timing belt. Otherwise, the drive motor 31d may be directly connected with the take-up shaft 37a of the take-up reel 37.

The negative film making means 30 utilizes a thermal transfer method and consists of the negative film drive portion 31, a fixed-type print head 32, a platen roller 33, the ink ribbon 34, the printing paper ribbon 35, the supply reel 36, the take-up reel 37, a roller 38 for changing the direction in which the ink ribbon 34 moves forward, and so forth. Further, the negative film making means 30 is controlled by the control portion 50 so that the imprint figure information on the imprint figure represented by the original picture read by the information reading mechanism 20 is transferred onto the ink ribbon in such a manner as to make the transfer ratio substantially equal to 1. In view of the fact that the transfer is performed in such a manner that the transfer ratio becomes substantially equal to 1, the size of the resin seal face member is selected as being equal to that of the original picture at least.

Moreover, as described above, the bottom wall of the drawer container 2 is made of a transparent material. The information reading mechanism 20 is adapted to scan the entire area of the bottom wall from one end to the other end thereof. Therefore, the negative film making means 30 of this first embodiment makes a negative film function portion by transferring an imprint figure, which corresponds to the imprint figure represented by the original picture 1, onto the ink ribbon 34 and simultaneously transfers the portions other than the original picture, which appear through the entire translucent bottom wall 2b of the container 2, onto the ink ribbon 34.

On the other hand, the printing paper ribbon 35 is put upon the ink ribbon 34, and these ribbons are wound around the supply reel 36. Further, these ribbons remaining overlapped are pulled out of the supply reel 36 and advance to a printing position between the fixed-type print head 32 and the platen roller 33.

The print head 32 emits heat in response to a control signal received from the control portion 50 and transfers ink of the ink ribbon 34 onto the printing paper ribbon 35.

Here, note that portions of the ink ribbon 34 of the thermal transfer type having been subject to the transferring lose ink and become transparent. Namely, after the transfer is performed, the ink ribbon 34 is composed of areas capable of transmitting ultraviolet (that is, areas from which ink is removed) and other areas preventing the transmission of ultraviolet (that is, areas where ink remains). Thus, the imprint figure and the images of the portions other than the original picture, which appear through the transparent wall 2b, are printed. Further, after the areas of the ink ribbon 34 corresponding to the imprint figure and the images of the portions other than the original picture become transparent, such an ink ribbon 34 is utilized as a negative film.

The ink ribbon 34 and the printing paper ribbon 35, which remain overlapped, pass through a printing portion consisting of the print head 32 and the platen roller 33 and thereafter reach the roller 38. Then, the printing paper ribbon 35 is separated from the ink ribbon 34 by this roller 38 and a ribbon separation mechanism associated with the roller 38.

The separated ink ribbon 34 then proceeds just above the ultraviolet setting resin layer 13b of the main body 10 of the seal. Subsequently, the ribbon 34 is taken up by the take-up reel 37. Incidentally, when performing an optical transfer processing of the imprint figure for hardening portions of the ultraviolet setting resin layer 13b corresponding to the imprint figure, the ink ribbon 34 stops at a position where the transparent part (namely, the negative film function portion) of the ink ribbon R2 corresponding to the imprint figure is placed just above the ultraviolet setting resin layer 13b.

The stopping of the negative film function portion (corresponding to the imprint figure) just above the ultraviolet setting resin layer 13b is achieved by controlling the negative film drive portion 31 by means of the control portion 50 in such a manner as to stop the entire transfer image formed by the negative film making means at a position corresponding to the entire area of the bottom wall of the drawer container 2.

On the other hand, the separated printing paper ribbon 35, on which the imprint figure is printed, is pulled out of the main unit 1 of the print making device through an ejection opening portion 8. Then, the ribbon 35 is cut by a manual or automatic cutter (not shown). A portion of the ink ribbon 35 cut in this manner is utilized for checking the imprint figure.

In the foregoing description, the case, in which the ink ribbon 34 and the printing paper ribbon 35 overlap with each other, has been described. It is, however, possible to use the ink ribbon 34 and the printing paper ribbon 35 by separating these ribbons from each other. In this case, the imprint figure formed on the ink ribbon 34 can be transferred onto the printing paper ribbon 35 by making the printing paper ribbon 35, which is pulled out of a ribbon supply reel 36A indicated by a two-dot chain circle in FIG. 3, contact the ink ribbon 34 between print head 32 and the platen roller 33.

The light irradiating means 40 is constructed as an ultraviolet irradiating unit. For instance, an ultraviolet irradiating light source 41 constituted by a fluorescent lamp is provided in, for instance, a fixed manner in the cover unit 5. Further, the turning-on and turning-off thereof is controlled according to a control signal sent from the control portion 50. Moreover, a transparent plate 42, which is caused by an advancement/retreat mechanism (not shown) to advance or retreat, is provided facing a surface of the ink ribbon 34, the other surface of which faces the ultraviolet setting resin layer 13b of the seal face member 13. Namely, light (that is, ultraviolet) emitted from the ultraviolet irradiating light source 41 reaches the ultraviolet setting resin layer 13b by way of the transparent plate 42 and the ink ribbon 34. Further, the transparent plate 42 adheres more closely to the ink ribbon 34 serving as the negative film and to the ultraviolet setting resin layer 13b at a descending position thereof. In contrast, the transparent plate 42 is placed at an ascending position thereof in such a manner not to obstruct the ink ribbon 34.

Both of end portions of the transparent plate 42 in the direction, in which the ink ribbon 34 runs, are, for example, rounded off in such a fashion not to damage the ink ribbon 34 when coming in contact therewith. Further, the rounded end portions of the transparent plate 42 protrude slightly from the general or bottom surface thereof in such a manner to serve to increase the tension of the ink ribbon 34 and adhere more closely to the seal face member 13 when the transparent plate 42 descends and makes the ink ribbon 34 come in contact with the seal face member 13.

Incidentally, a lens system and a mirror system for converging irradiated light onto the ultraviolet setting resin layer 13b may be provided between the ultraviolet irradiating light source 41 and the transparent plate 42. Further, a large amount of pressure is applied onto the ink ribbon 34, though the magnitude thereof may depend on the structure of the fixture for fixing the main body 10 of the seal. Therefore, it is preferable to form the ink ribbon 34 made of a sheet member having a resistance to the pressure applied perpendicularly thereto, which is higher than that of an ordinary material of the sheet member of the ink ribbon.

In the case of the seal making device constructed as described hereinabove, a seal is made by performing the following procedure.

First, a maker of the seal places an original on the original picture holding member 15 by turning the face, on which the original picture 1 is drawn, of the original downwardly. Moreover, the maker puts the ultraviolet setting resin layer 13b of the resin seal face member 13 on the top surface of the seal face holding member 11 by turning the resin layer 13b upwardly. At that time, the original picture 1 and the seal face member 13 are joined by fitting the original picture holding member 15 to the seal face holding member 11 in such a manner that the original picture 1 is placed just in back of the resin seal face member 13. Subsequently, the original picture 1 and the seal face member 13 are joined by fitting the fitting convex portion 15a of the original picture holding member 15 to the fitting concave portion 11a of the seal face holding member 11. Then, the combination of the original picture 1 and the seal face member 13 is inserted and set against the elastic force of the elastic pressing member 7 between the presser members 6 and 6 in the container 2 pulled out of the main unit 3 of the print (seal) making unit by gripping the pull 2a (see FIG. 5).

Next, the maker pushes down a reading instruction switch (refer to reference character 4) so as to instruct the device to read the image. Thereby, the information reading mechanism 20 is activated and reads the image of the imprint figure represented by the original picture 1 and the images of the portions other than the original picture, which appear through the transparent bottom wall. Then, electrical signals representing information on the read imprint figure and the images of the portions other than the original picture, which appear through the transparent bottom wall, are transmitted to the control portion 50. Thereafter, a control signal is transmitted from the control portion 50 to the print head 32 of the negative film making means 30. Thereby, the print head 32 emits heat and transfers ink of the ink ribbon 34 onto the printing paper ribbon 35. Thus a transfer image containing a portion functioning as a negative film is formed. After this transfer image is formed, the drive motor 31d rotates through a predetermined angle or a predetermined number of revolutions, so that this transfer image portion is transported to the position corresponding to the entire area of the bottom wall of the container 2 and is stopped there. At that time, the negative film function portion stops at a position just above the ultraviolet setting resin layer 13b of the seal face member 13. At this time, the printing paper ribbon 35, on which the imprint figure is printed, is separated from the ink ribbon 34 by the ribbon separation mechanism 39, and the separated ribbon 35 is ejected from an ejection opening 8 and is cut by a manual or automatic cutter (not shown).

Next, in response to the control signal from the control portion 50, the device is instructed to perform an optical transfer of the imprint figure onto the seal face member 13 by use of the light irradiating means 40. At that time, the transparent plate 42 goes down to make the portion of the ink ribbon 34, which corresponds to the imprint figure, adhere closely to the ultraviolet setting resin layer 13b. Thereafter, the irradiating light source 41 emits light for a predetermined period of time.

As the result of such irradiation, an irradiated part (an imprint figure part) of the ultraviolet setting resin layer 13b of the seal face member 13 hardens. For example, during the irradiation of the light, an irradiation-in-progress indication lamp constituted by, for instance, an LED (not shown) is turned on. When the predetermined period of time for the irradiation of the light expires, this lamp is turned off. When noticing the termination of the irradiation of the light from the turning-off of the lamp, the maker grips the pull 2a and pulls the container 2 out of the main unit 3 of the print making device. Then, the original picture 1 and the main body 10 of the seal are taken out therefrom. Thereafter, the seal face holding member 11 is detached from the original picture holding member 15 (see FIG. 6(a)). Subsequently, the maker washes the ultraviolet setting resin layer 13b by the predetermined kind of liquid to remove parts thereof other than the hardened part thereof, so that an uneven seal face 17 is formed. Then, the fitting concave portion 14a provided at an end of the spacing member 14 is fitted and fixed to the fitting concave portion 11a of the seal face holding member 11. Moreover, the fitting convex portion 15a of the original picture holding member 15 is fitted and fixed to the fitting concave portion provided on the other end of the spacing member 14. Thus, the seal (namely, the stamp unit) is constructed (see FIG. 6(c)). Incidentally, in view of the portability, the stamp unit may be constituted by the seal face holding member 11 and the original picture holding member 15 without using the spacing member 14.

In the case of the aforesaid first embodiment, the image reading mechanism portion, which consists of the original picture and the information reading mechanism, and the light irradiating portion, which consists of the resin seal face member and the light irradiating means, are vertically arranged to reduce floor-space occupied by the main unit of the print making device. Consequently, a compact main unit of the print making device can be realized. Further, a transfer image having substantially the same size as that of the imprint figure represented by the original picture is formed in the negative film function portion by the negative film making means. This negative film function portion is positioned facing the resin seal face member. When in this position, the resin seal face member is irradiated with light by the light irradiating means through the aforementioned negative film function portion. Thus a setting resin portion, which corresponds to the imprint figure represented by the original picture, can be surely formed in such a manner as to have substantially the same size as of the imprint figure represented by the original picture. Thereby, there is no necessity of regulating the position and size of the setting resin portion formed in the resin seal face member. Consequently, the face of the seal can be accurately formed.

Further, in the case of this first embodiment, the negative film making means is adapted to obtain the transfer ratio of 1. In addition to this, the negative film making means is constructed in such a manner that the entire area of the translucent bottom wall of the container is scanned by the information reading mechanism, that further, the original picture and the images of the portions other than the original picture, which appear through the transparent bottom wall, are transferred onto the ink ribbon, and that the transfer image portion obtained in this way is transported to the position where the transfer image portion faces the entire area of the transparent bottom wall. Therefore, the negative film function portion, to which the imprint figure portion is transferred, can be transported to and stopped at a position just above the seal face member by transporting the aforementioned transfer image portion formed on the ink ribbon from the transfer position of the print head by a predetermined distance. Thus it is unnecessary to provide control elements, such as a position-of-original-picture detecting means, in the device. Consequently, the configuration of the control portion can be simplified.

Furthermore, the negative film making means is constructed as described above. Thus, at whatever position in the space formed between the two presser members contained by the container the integrated member consisting of the seal face holding member and the original picture holding member is placed, the negative film function portion can be stopped at the position where such a portion faces the seal face member. Thus the positioning of the integrated member, namely, the original picture and the seal face member can be achieved extremely easily.

In the case of the first embodiment, the original picture holding member and the seal face holding member are formed in such a manner that these members can be integral with each other by being detachably fitted to each other. Further, the free edge or end of the original picture holding member is formed in such a manner as to be able to hold the original picture. Therefore, the original picture holding member, which is provided with the original picture, and the seal face holding member, which is provided with the seal face member, can function as a stamp unit. Furthermore, the spacing member is not fitted to the aforementioned integrated member. Consequently, the portability of the stamp unit can be improved. Additionally, the original picture holding member and the seal face holding member can be accommodated in the container by integrating these two members as a single-piece without using the spacing member. Thereby, a compact print making device can be realized.

Further, the original picture holding member and the seal face holding member are formed in such a manner as to be detachably attached to each other. Moreover, the original picture holding member, which holds the original picture, can be separated from the seal face holding member when washing the setting resin layer of the seal face member. Thus the detachable combination of the original picture holding member and the seal face holding member can prevent the wash (namely, the cleaning liquid) from adhering to the original picture when washing the seal face member.

Furthermore, the original picture holding member and the seal face holding member are formed in such a manner that the spacing member can be provided between these two holding members. Thus, in the case where the integrated member, consisting of the original picture holding member, and the seal face holding member does not have sufficiently good hold-ability if used as a stamp unit, the spacing member is inserted between the original picture holding member and the seal face holding member. Thereby, the ease of use of the stamp unit at the time of affixing thereof can be enhanced.

(B) Second Embodiment

Hereinafter, a second example of a print making device embodying the present invention, namely, a second embodiment of the present invention will be described in detail with reference to the drawings. Incidentally, this print making device, namely, the second embodiment of the present invention is also characterized by a mechanical optical system. Therefore, the following description centers on the mechanical optical system. Further, the description of an electrical system will be omitted herein (incidentally, regarding the electrical system of this embodiment, refer to, for example, the specification and drawings of the PCT International Application No. PCT/JP94/00409 corresponding to the Japanese Patent Application No. 5-69499/1993).

Figure 8:
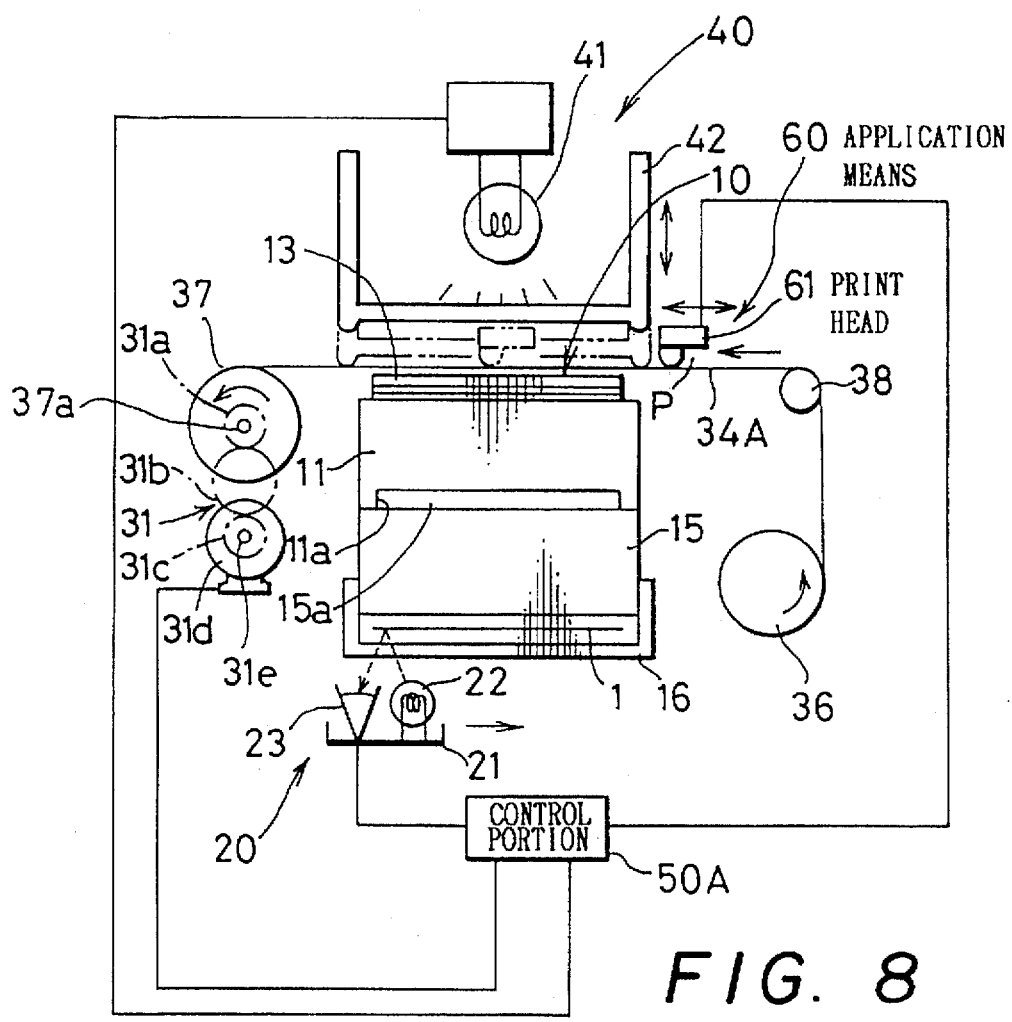
FIG. 8 is a schematic sectional view of another print making device, namely, a second embodiment of the present invention.

This print making device, namely, the second embodiment of the present invention is not provided with a keying input portion as disclosed in the aforesaid Japanese Patent Application. Namely, this print making device has only the information reading mechanism 20 as means for taking in the imprint figure. Thus this print making device has the configuration as illustrated in FIG. 8. Incidentally, in this figure, the same reference characters designate the same or corresponding parts of the drawings which have been described hereinabove.

This print making device, namely, the second embodiment, basically has the same configuration as that of the first embodiment except that in the case of the second embodiment, an application means 60 for applying a processing agent, such as ink, by which the transmission of light having a wavelength within a predetermined range is blocked, is provided in the seal face member 13 or in another element, instead of the negative film making means of the first embodiment.

The application means 60 consists of a movable type print head 61, an ink ribbon 34A, the supply reel 36 for supplying the ink ribbon 34A, the take-up reel 37 for taking up the ink ribbon and the roller 38 for changing the direction in which the ink ribbon 34A moves forward.

The movable type print head 61 is adapted to scan above the seal face member 13, which is set in the container 2, by means of a moving mechanism (not shown) and to emit heat and subsequently transfer ink of the ink ribbon 34A onto the ultraviolet setting resin layer 13b when a heating drive circuit (not shown) is activated and operates in accordance with a control signal sent from the control circuit 50A serving as the imprint figure transfer control means. Further, the print head 61 is adapted to move under the control of the control portion 20 when a movement drive circuit (not shown) is activated and operates in accordance with a control signal sent from the control circuit 50A. Incidentally, in the case of this embodiment, the home position P of the movable type print head 61 in a stand-by state is spaced from a region connecting the ultraviolet setting resin layer 13b with the ultraviolet irradiating light source 41 in such a manner not to hinder exposure.

Figure 9:
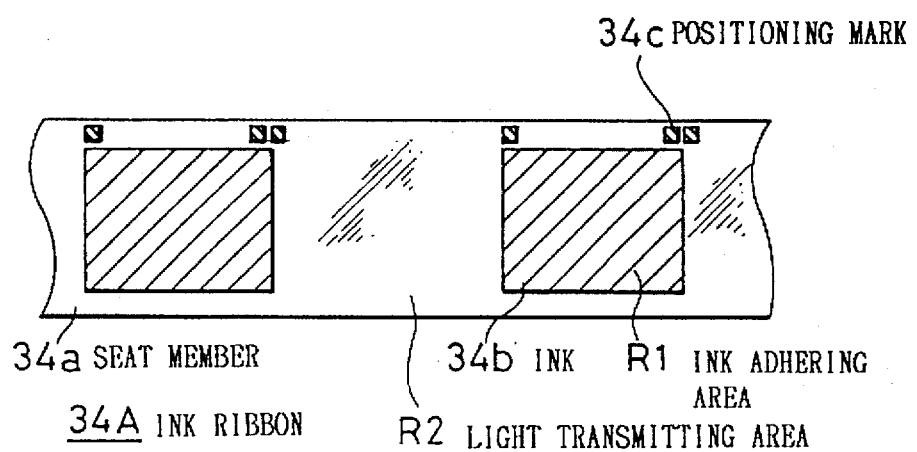
FIG. 9 is a plan view of an ink ribbon of the second embodiment of the present invention.

The ink ribbon 34A is constituted by making ink 34b selectively adhere to a sheet member 34a which is able to transmit ultraviolet, as is seen from a plan view thereof illustrated in FIG. 9. Further, a mark 34c, which should be detected by an ink ribbon position detecting sensor (not shown) for identifying which of the ink adhering area R1 and the light transmitting area R2 an area facing the ultraviolet setting resin layer 13b is, is formed on the ink ribbon 34A. Here, ink (for example, black ink) preventing the transmission of ultraviolet light is selected as the ink 34b. Further, the size of the ink adhering area R1 is set as equal to or greater than the area of the ultraviolet setting resin layer 13b of the largest main body 10 of the seal. Moreover, the size of the light transmitting area R2 is set as being equal to or greater than that of the ink adhering area R1.

In the case of this second embodiment, the control means 50A controls the application means 60, whereby the imprint figure represented by the original picture 1 is transferred onto the seal face member 13 in such a manner that the transfer ratio becomes substantially equal to 1. Moreover, similarly as in the case of the first embodiment, the size of the seal face member 13 is set as being at least equal to that of the original picture 1.

In the case where a seal is made by using the print making device, namely, the second embodiment having the aforementioned configuration, first, the main body 10 of the seal, which consists of the original picture 1 and the seal face member 13, is set in the device.

Next, the maker depresses the reading instruction switch 4 so as to instruct the device to read the image. Thereby, the information reading mechanism 20 is activated and performs the reading of the image of the imprint figure represented by the original picture 1. Then, an electrical signal representing information on the read imprint figure is transmitted to the control portion 50A. Thereafter, a control signal is transmitted from the control portion 50A to the movable type print head 61 of the application means 60. Thereby, the movable type print head 61 is activated and driven and applies the ink 34b onto the ultraviolet setting resin layer 13b according to the imprint figure information.

Next, in response to the control signal from the control portion 50A, the device is instructed to perform an optical transfer of the imprint figure onto the seal face member 13 by use of the light irradiating means 40. At that time, the movable type print head 61 retreats to a stand-by position. Further, the transparent plate 42 descends to make the ink ribbon 34A adhere closely to the ultraviolet setting resin layer 13b. Thereafter, the irradiating light source 41 emits light for a predetermined period of time.

As the result of such irradiation of light, an irradiated part (an imprint figure part) of the ultraviolet setting resin layer 13b of the seal face member 13 hardens. Thereafter, the similar operation is performed so as to complete the seal (see FIG. 6(c)).

Thus, in the case of the second embodiment, the image reading mechanism portion, which consists of the original picture and the information reading mechanism, and the light irradiating portion, which consists of the resin seal face member and the light irradiating means, are vertically arranged as in the case of the first embodiment, to reduce the floor-space occupied by the main unit of the print making device. Consequently, a compact main unit of the print making device can be realized. Further, the imprint figure represented by the original picture is transferred by the application means to the seal face member at a transfer ratio which is substantially equal to 1. Thereby, a setting resin portion, which corresponds to the imprint figure represented by the original picture, can be accurately formed to have substantially the same size as of the imprint figure represented by the original picture. Consequently, the face of the seal can be accurately formed.

Figure 6A:
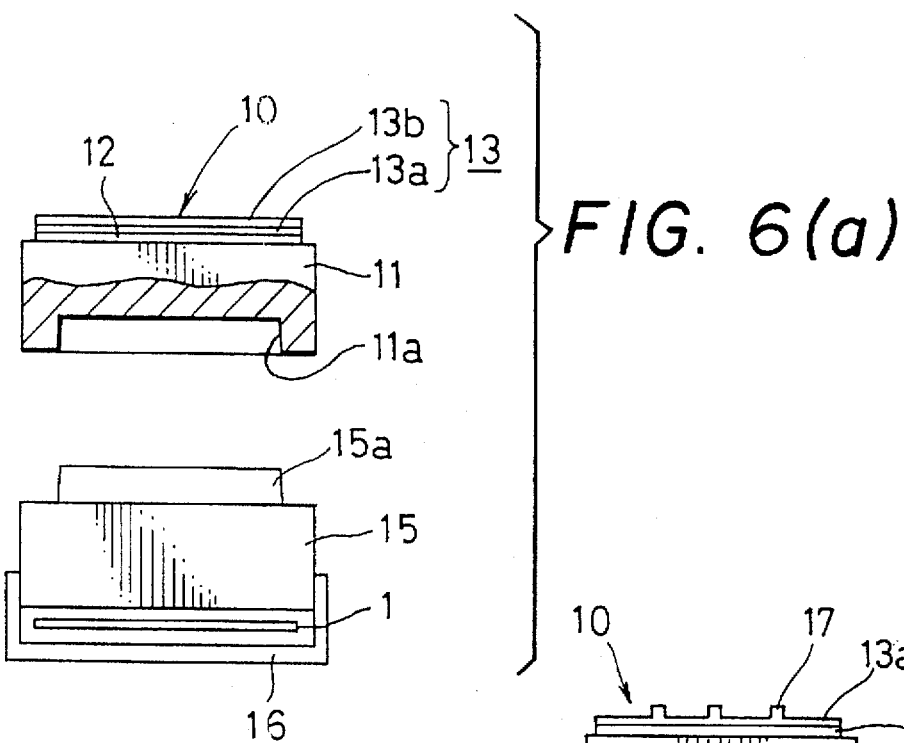
FIGS. 6(a), 6(b) and 6(c) are diagrams illustrating how an original-picture holding member, a seal face holding member and a spacing member are attached to or detached from the print making device, namely, the first embodiment of the present invention.
Figure 6B:
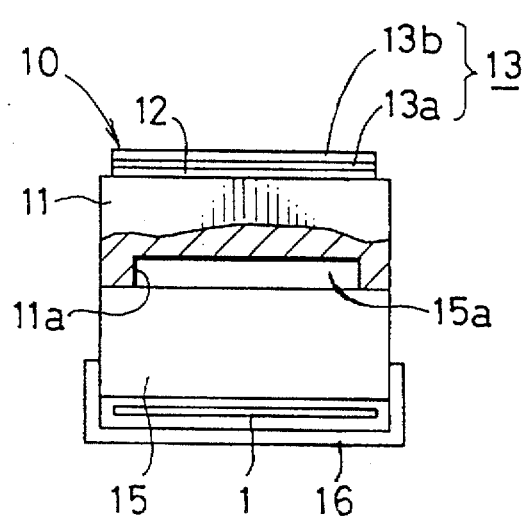
Figure 6C:
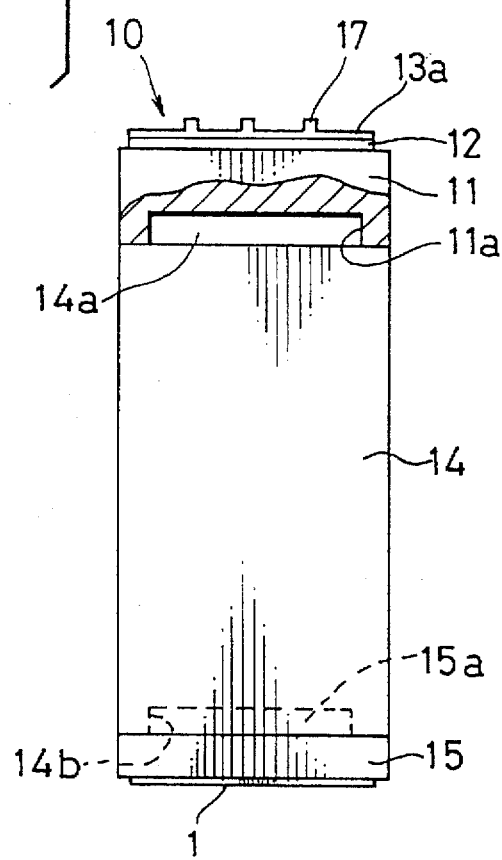
Figure 7A:
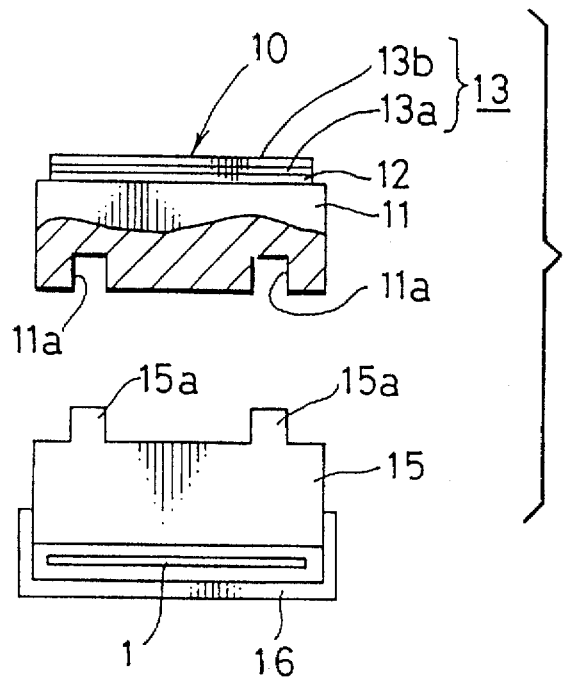
FIGS. 7(a), 7(b) and 7(c) are diagrams for illustrating how the original-picture holding member and the seal face holding member are attached to or detached from each other, and how the seal face holding member and an integrating member having tongue portions are attached to or detached from each other.
Figure 7B:
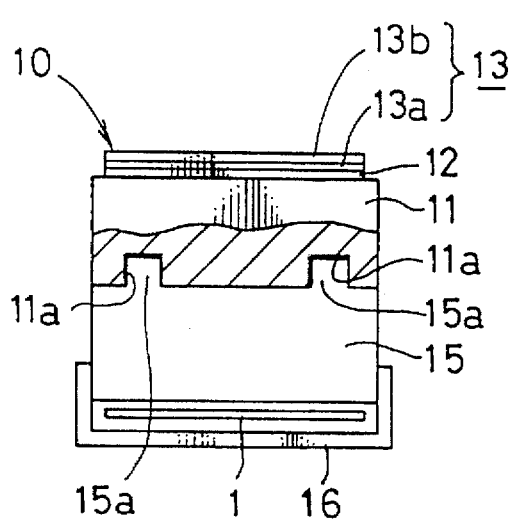
Figure 7C:
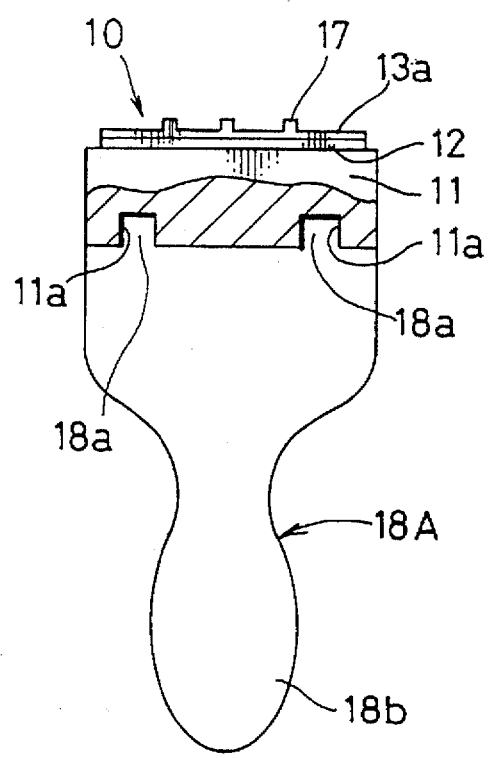

Further, in the cases of the first and second embodiments, the single fitting convex portion 15a and the single seal face holding member 11 are provided in the original picture holding member 15 and the seal face holding member 11, respectively. Further, as illustrated in FIGS. 6(a) to 6(c), the original picture holding member 15 and the seal face holding member 11 are detachably fitted to each other and are inserted into the container 2. In the foregoing description, there has been described the case where the spacing member 14 is inserted between the seal face holding member 11 and the original picture holding member 15 when the face of the seal is used for affixing after the face of the seal is formed. It is, however, unnecessary to limit the shapes of the fitting convex and concave portions to those of the portions 15a and 11a, respectively. For example, as illustrated in FIGS. 7(a) to 7(c), a plurality of fitting convex portions 15a and a plurality of fitting concave portions 11a (for instance, two fitting convex portions 15a and two fitting concave portions 11a) may be formed. Alternatively, the original picture holding member 15 and the spacing member 14 may be integrally formed as an integrated member 18A. Further, a tongue portion 18b may be formed on each of the integrated members 18A (see FIG. 7(c)).

(C) Other Embodiments

The present invention is not limited to the aforementioned embodiments. Various modifications of the embodiments of the present invention may be made and examples of the modifications of the embodiments of the present inventions are as follows.

(1) The method for making a portion serving as a negative film is not limited to that of the first embodiment. A liquid crystal display panel can be made to serve as a negative film by setting the turning-on and turning-off of each of the cells thereof. Alternatively, an area, which corresponds to an imprint figure, or the remaining area of the heat reversible transmittance changing film is heated and thus such an area may serve as the portion as a negative film.

(2) A visible-light setting resin may be employed as a material of the seal face member, instead of the ultraviolet setting resin. In this case, naturally, the range of the wavelength of light emitted from the light source is different from that of the aforementioned embodiments.

(3) The printing method is not limited to the thermal transfer method. Ink jet printing or a wire dot printing method may be applied to the device. Incidentally, the ink jet printing method can not be applied to the first embodiment.

(4) A material, which can be hardened or softened by a physical factor other than ultraviolet, may be employed instead of the setting resin layer. For example, a visible-light setting resin or an ultraviolet softening resin may be used.

(5) In the cases of the aforementioned embodiments, the imprint figure is transferred by making the negative film adhere closely to the ultraviolet setting resin layer 13b. The imprint figure, however, may be transferred by spacing the negative film and the ultraviolet setting resin layer 13b and further providing an optical system such as an objective lens therebetween.

(6) In the cases of the aforementioned embodiments, the ink ribbon or the printing paper ribbon, which corresponds to the negative film, is transported to a light irradiation position without changing the continuous ribbon-like shape thereof. The ink ribbon or the printing paper ribbon may be cut into a piece having a predetermined length and be carried to the irradiation position.

(7) In the cases of the aforementioned embodiments, the light irradiating means is constituted by the ultraviolet irradiating light source having the ultraviolet lamp. An imprint figure transfer optical system means for guiding and irradiating light, which is emitted from an ultraviolet irradiating laser light source, by utilizing a light switch or a polygon mirror may be employed as the light irradiating means.

(8) In the cases of the aforementioned embodiments, the print making device of the present invention is applied to the seal making device. Apparently, the present invention can be applied to a device for printing a desired imprint figure, such as a guide indication, on a plate-like resin seal face member like a nameplate or a guide plate.

(9) In the cases of the aforementioned embodiments, the original picture and the seal face member are set in lower and upper horizontal planes, respectively. Moreover, the information reading means and the light irradiating means are provided under the original picture and above the seal face member, respectively. However, the original picture and the seal face member may be set in, for instance, left-side and right-side vertical planes, respectively. Moreover, the information reading means and the light irradiating means are provided on the left side of the original picture and on the right side of the seal face member, respectively.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. An apparatus for making a stamp from an original picture comprising:

a housing;

holding means, mountable within said housing, for holding the original picture on one end face thereof and for holding a resin stamp blank, from which the stamp is to be made, on a second end face thereof, opposite said one end face;

information reading means, mounted within said housing, aligned with said holding means and facing said one end face, for reading imprint figure information from the original picture;

negative film making means for receiving the imprint figure information from said information reading means and for transferring the imprint figure information onto an ink ribbon to thereby make a negative film;

conveying means for conveying the ink ribbon to a position where the transferred imprint figure information faces the resin stamp blank held on the holding means; and light irradiating means, aligned with said holding means and, through said holding means, with said information reading means, and facing the resin stamp blank and said second end face, for irradiating areas of the resin stamp blank, through the negative film, with light having a wavelength within a predetermined range to produce irradiated areas in the resin stamp blank having a solubility in a developing fluid different from solubility in the developing fluid of non-irradiated areas, whereby the irradiated blank can be contacted with the developing fluid to produce the stamp.

2. An apparatus for making a stamp from an original picture according to claim 1, further comprising control means for controlling said negative film making means so as to transfer the imprint figure information read by said information reading means onto the ink ribbon to remove ink from said ink ribbon to form non-inked areas corresponding to the imprint figure information, in such a manner that a ratio of inked areas to non-inked areas on the negative film is substantially equal to a ratio of print areas of imprint figure information to non-print areas on the original picture.

3. An apparatus for making a stamp from an original picture according to claim 1 wherein said holding means comprises:

an original picture holding member including said one end face and a first connecting face, provided with a first fitting, opposite said one end face; and a resin stamp blank holding member including said second end face and a second connecting face, with a second fitting, opposite said second end face, said first fitting and said second fitting mating for detachably coupling said original picture holding member to said resin stamp blank holding member.

4. An apparatus for making a stamp from an original picture according to claim 3 wherein said holding means further comprises a spacer member having a third end face with a third fitting and a fourth end face with a fourth fitting, opposite said third end face, said third fitting mating with said first fitting to detachably couple said spacer member to said original picture holding member and said fourth fitting mating with said second fitting to detachably couple said spacer member to said resin stamp blank holding member.

5. An apparatus for making a stamp from an original picture according to claim 2 wherein said holding means comprises:

an original picture holding member including said one end face and a first connecting face, provided with a first fitting, opposite said one end face; and a resin stamp blank holding member including said second end face and a second connecting face, with a second fitting, opposite said second end face, said first fitting and said second fitting mating for detachably coupling said original picture holding member to said resin stamp blank holding member.

6. An apparatus for making a stamp from an original picture according to claim 5 wherein said holding means further comprises a spacer member having a third end face with a third fitting and a fourth end face with a fourth fitting, opposite said third end face, said third fitting mating with said first fitting to detachably couple said spacer member to said original picture holding member and said fourth fitting mating with said second fitting to detachably couple said spacer member to said resin stamp blank holding member.

7. An apparatus for making a stamp from an original picture according to claim 1 wherein said housing includes a slidable drawer containing clamping means for receiving and holding said holding means.

8. An apparatus from an original picture according to claim 1 wherein said negative film making means includes a heating element for thermal transfer of areas of ink corresponding to the read imprint figure information from the ink ribbon onto a paper substrate, thereby developing the ink ribbon into the negative film.

9. An apparatus for making a stamp from an original picture according to claim 3, further comprising an enclosure for enclosing said holding means, said enclosure having a translucent bottom wall, whereby the imprint figure information on the original picture can be read by said information reading means through said translucent bottom wall of said enclosure.

10. An apparatus for making a stamp from an original picture according to claim 9 wherein said enclosure is a drawer slidably mounted in said housing.

11. An apparatus for making a stamp from an original picture comprising:

a housing;

holding means, mountable within said housing, for holding the original picture on one end face thereof and for holding a resin stamp blank, from which the stamp is to be made, on a second end face thereof, opposite said one end face;

information reading means, mounted within said housing, aligned with said holding means and facing said one end face, for reading imprint figure information from the original picture;

transfer means for transferring the imprint figure information read by said information reading means as a mask of an agent imprinted onto said resin stamp blank, said agent preventing transmission of light having a wavelength within a predetermined range and being removable; and light irradiating means, aligned with said holding means and, through said holding means, with said information reading means, and facing the resin stamp blank to produce irradiated areas free of the imprinted agent, the irradiated areas in the resin stamp blank having a solubility in a developing fluid different from solubility in the developing fluid of the imprinted areas, whereby the irradiated blank can be contacted with the developing fluid to produce the stamp.

12. An apparatus for making a stamp from an original picture according to claim 11, further comprising control means for controlling the transfer the read imprint figure information onto the resin stamp blank in such a manner that a ratio of agent-imprinted areas to non-imprinted areas on the resin stamp blank is substantially equal to a ratio of print areas of imprint figure information to non-print areas on the original picture.

13. An apparatus for making a stamp from an original picture according to claim 11 wherein said holding means comprises:

an original picture holding member including said one end face and a first connecting face, provided with a first fitting, opposite said one end face; and a resin stamp blank holding member including said second end face and a second connecting face, with a second fitting, opposite said second end face, said first fitting and said second fitting mating for detachably coupling said original picture holding member to said resin stamp blank holding member.

14. An apparatus for making a stamp from an original picture according to claim 13 wherein said holding means further comprises a spacer member having a third end face with a third fitting and a fourth end face with a fourth fitting, opposite said third end face, said third fitting mating with said first fitting to detachably couple said spacer member to said original picture holding member and said fourth fitting mating with said second fitting to detachably couple said spacer member to said resin stamp blank holding member.

15. An apparatus for making a stamp from an original picture according to claim 12 wherein said holding means comprises:

an original picture holding member including said one end face and a first connecting face, provided with a first fitting, opposite said one end face; and a resin stamp blank holding member including said second end face and a second connecting face, with a second fitting, opposite said second end face, said first fitting and said second fitting mating for detachably coupling said original picture holding member to said resin stamp blank holding member.

16. An apparatus for making a stamp from an original picture according to claim 15 wherein said holding means further comprises a spacer member having a third end face with a third fitting and a fourth end face with a fourth fitting, opposite said third end face, said third fitting mating with said first fitting to detachably couple said spacer member to said original picture holding member and said fourth fitting mating with said second fitting to detachably couple said spacer member to said resin stamp blank holding member.

17. An apparatus for making a stamp from an original picture according to claim 11 wherein said housing includes a slidable drawer containing clamping means for receiving and holding said holding means.

18. An apparatus for making a stamp from an original picture according to claim 17, further comprising an enclosure for enclosing said holding means, said enclosure having a translucent bottom wall, whereby the imprint figure information on the original picture can be read by said information reading means through said translucent bottom wall of said enclosure.

19. An apparatus for making a stamp from an original picture according to claim 17 wherein said enclosure is a drawer slidably mounted in said housing.

* * * * *

UNITED STATES PATENT AND TRADEMARK OFFICE
CERTIFICATE OF CORRECTION

PATENT NO.    : 5,745,222                           Page 1 of 2
DATED         : April 28, 1998
INVENTOR(S)   : KAMEDA et al It is certified that error appears in the above-indentified patent and that said Letters Patent is hereby corrected as shown below:

Col. 1, line 45, after "washed" insert --with--.

Col. 2, line 8, after "violet" insert --light--;
        line 35, after "of" insert --the--; and
        line 45, delete "a", third instance.

Col. 4, line 16, delete "devices" insert --device--;
        line 48, delete "porion" insert --portion--; and
        line 55, delete "devices" insert --device--.

Col. 5, line 15, delete "of";
        line 54, delete "devices" insert --device--.

Col. 6, line 40, delete "porion" insert --portion--;
        line 48, delete "second" insert --third--;
        line 57, delete "being";
        line 63, delete "of".

Col. 7, line 15, delete "of".

Col. 9, line 42, after "ultraviolet" insert a period --.--.

UNITED STATES PATENT AND TRADEMARK OFFICE
CERTIFICATE OF CORRECTION

PATENT NO. : 5,745,222         Page 2 of 2
DATED      : April 28, 1998
INVENTOR(S): KAMEDA et al It is certified that error appears in the above-indentified patent and that said Letters Patent is hereby corrected as shown below:

Col. 10, line 22, after separation" insert --of--; and
         line 46, delete "the both of".

Col. 18, line 30, delete "the", second instance, insert --a--.

Col. 19, line 21, delete "portion as a".

Col. 21, line 42, after "apparatus" insert --for making a stamp--.

Col. 22, line 20, after "transfer" insert --of--

Col. 24, line 5, delete "17" insert --18--.

Signed and Sealed this

Second Day of March, 1999

Attest:

Q. TODD DICKINSON

*Attesting Officer*    *Acting Commissioner of Patents and Trademarks*